(12) United States Patent
Tsujiyama et al.

(10) Patent No.: US 9,721,747 B2
(45) Date of Patent: Aug. 1, 2017

(54) GRID, METHOD OF MANUFACTURING THE SAME, AND ION BEAM PROCESSING APPARATUS

(71) Applicant: CANON ANELVA CORPORATION, Kawasaki-shi (JP)

(72) Inventors: Masashi Tsujiyama, Kawasaki (JP); Yukito Nakagawa, Kawasaki (JP); Yasushi Yasumatsu, Kawasaki (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 0 days.

(21) Appl. No.: 15/366,660

(22) Filed: Dec. 1, 2016

(65) Prior Publication Data

US 2017/0084419 A1    Mar. 23, 2017

Related U.S. Application Data

(63) Continuation of application No. PCT/JP2015/005851, filed on Nov. 25, 2015.

(30) Foreign Application Priority Data

Mar. 16, 2015    (JP) .................................. 2015-052363

(51) Int. Cl.
*H01J 9/14* (2006.01)
*H01J 27/02* (2006.01)
*H01J 27/16* (2006.01)
*H01J 37/04* (2006.01)
*H01J 37/08* (2006.01)

(52) U.S. Cl.
CPC .............. *H01J 27/024* (2013.01); *H01J 9/14* (2013.01); *H01J 27/16* (2013.01); *H01J 37/04* (2013.01); *H01J 37/08* (2013.01); *H01J 2237/303* (2013.01); *H01J 2237/3174* (2013.01); *H01J 2237/31701* (2013.01)

(58) Field of Classification Search
None
See application file for complete search history.

(56) References Cited

U.S. PATENT DOCUMENTS

| 5,284,544 | A | 2/1994 | Mizutani et al. |
| 5,548,953 | A | 8/1996 | Hedges et al. |
| 6,885,010 | B1 * | 4/2005 | Traynor ................. B82Y 10/00 250/423 R |

(Continued)

FOREIGN PATENT DOCUMENTS

| JP | 4-180621 A | 6/1992 |
| WO | 2016/147232 A1 | 9/2016 |

OTHER PUBLICATIONS

STIC Non patent literature search information on Carbon-carbon composites is included from Science.gov/science direct.*

(Continued)

*Primary Examiner* — Douglas W Owens
*Assistant Examiner* — Srinivas Sathiraju
(74) *Attorney, Agent, or Firm* — Fitzpatrick, Cella, Harper & Scinto

(57) ABSTRACT

A grid of the present invention is a plate-shaped grid provided with a hole. The grid is formed of a carbon-carbon composite including carbon fibers arranged in random directions along a planar direction of the grid, and the hole is formed in the grid so as to cut off the carbon fibers.

5 Claims, 8 Drawing Sheets

(56) References Cited

U.S. PATENT DOCUMENTS

| | | | | |
|---|---|---|---|---|
| 7,034,290 B2* | 4/2006 | Lu | ............... | B82Y 10/00 250/288 |
| 7,075,067 B2* | 7/2006 | Joyce | ............... | H01J 49/147 250/288 |
| 7,129,513 B2* | 10/2006 | Zhou | ............... | H01J 27/26 257/10 |
| 7,507,972 B2* | 3/2009 | Rush | ............... | H01T 19/00 250/423 F |
| 7,633,715 B2* | 12/2009 | Higuchi | ............... | G11B 5/012 360/125.74 |
| 7,750,297 B1* | 7/2010 | Chow | ............... | G21K 1/02 250/306 |
| 7,834,530 B2* | 11/2010 | Manohara | ............... | B82Y 10/00 313/310 |
| 8,288,723 B2* | 10/2012 | Zhang | ............... | H01J 37/20 250/306 |
| 8,294,098 B2* | 10/2012 | Zhang | ............... | H01J 37/20 250/306 |
| 8,357,881 B2* | 1/2013 | Feng | ............... | H05B 3/342 219/529 |
| 8,841,588 B2* | 9/2014 | Liu | ............... | H05B 3/145 219/520 |
| 9,230,772 B2* | 1/2016 | Zhou | ............... | H01J 27/02 |
| 2005/0098720 A1* | 5/2005 | Traynor | ............... | B82Y 10/00 250/288 |
| 2014/0353142 A1* | 12/2014 | Nakagawa | ............... | H01J 37/32651 204/192.34 |
| 2016/0351377 A1* | 12/2016 | Okamoto | ............... | H01J 37/32357 |

OTHER PUBLICATIONS

International Search Report in International Application No. PCT/JP2015/005851 (mailed Dec. 2015).

* cited by examiner

GRID, METHOD OF MANUFACTURING THE SAME, AND ION BEAM PROCESSING APPARATUS

CROSS-REFERENCE TO RELATED APPLICATIONS

This application is a continuation application of International Application No. PCT/JP2015/005851, filed Nov. 25, 2015, which claims the benefit of Japanese Patent Application No. 2015-052363 filed Mar. 16, 2015. The contents of the aforementioned applications are incorporated herein by reference in their entireties.

BACKGROUND OF THE INVENTION

Field of the Invention

The present invention relates to a grid plate, a method of manufacturing the same, and an ion beam processing apparatus.

Description of the Related Art

Ion beam processing such as etching and ion implantation has widely been practiced in manufacturing processes of electronic components and the like. An ion beam processing apparatus used in this processing is often equipped with a thin plate (hereinafter referred to as a grid) including multiple holes used for extracting ions from plasma. This ion beam processing apparatus performs processing by irradiating a processing object with ions, which are originated from the plasma and transformed into beams as a consequence of passage through the holes in the grid.

Japanese Patent Application Laid-Open No. Hei 4-180621 describes a particle beam etching apparatus that includes grids. The particle beam etching apparatus uses the grids in a mesh form, each of which is formed either from layered films of carbon and silicon or from carbon fibers.

U.S. Pat. No. 5,548,953 describes a grid that uses a carbon-carbon composite as its material. The carbon-carbon composite in U.S. Pat. No. 5,548,953 has a structure in which some filaments of carbon fibers are bundled into strands that are then arranged in a woven fabric form and embedded into a carbon matrix (a base material) provided with multiple holes. As arrangement examples of the carbon fibers in the woven fabric form, U.S. Pat. No. 5,548,953 discloses the following examples in which: the carbon fibers are arranged parallel to three axes offset by 60° from one another (FIG. 7 of U.S. Pat. No. 5,548,953); the carbon fibers are snaked so as to skirt the holes (FIG. 8 of U.S. Pat. No. 5,548,953); and the carbon fibers are arranged in a lattice fashion (FIG. 9 of U.S. Pat. No. 5,548,953).

SUMMARY OF THE INVENTION

The grid described in Japanese Patent Application Laid-Open No. Hei 4-180621 is formed from layered films of carbon and silicon or from carbon fibers, and does not include a base material. For this reason, the grid is low in rigidity and has a risk of insufficient strength when the grid is increased in size to accommodate an increase in diameter of an ion beam source.

The grid described in U.S. Pat. No. 5,548,953 employs the carbon-carbon composite as its material. Accordingly, the grid has high rigidity and has no risk of insufficient strength when the grid is increased in size to accommodate an increase in diameter of an ion beam source. However, the holes are formed in the grid described in U.S. Pat. No. 5,548,953 in such a way as to skirt the carbon fibers in the woven fabric form which are arranged in the carbon matrix. For this reason, it is difficult to position the holes appropriately during the processing thereof and to manufacture the grid stably.

On the other hand, if no holes are formed in such a way as to skirt the carbon fibers in the woven fabric form which are arranged in the carbon matrix unlike U.S. Pat. No. 5,548,953, then it is necessary to form such holes in the carbon-carbon composite. The inventors of this application have found out that there is a risk of causing problems as shown below in this case.

Note that carbon fibers that are knitted regularly in longitudinal and lateral directions into a woven fabric form will be referred to as a "crossed member" in this specification. The carbon-carbon composite using the crossed member is manufactured by impregnating the crossed member with a carbon-containing raw material for the matrix such as a thermosetting resin, and then heating and carbonizing the crossed member. As a consequence, the carbon-carbon composite using the crossed member includes the carbon fibers which expand in two directions perpendicular to each other, namely, in the longitudinal direction and the lateral direction.

FIG. 4 and FIG. 5 are conceptual diagrams showing positional relations between a carbon fiber and a hole when the hole is formed in the carbon-carbon composite using the crossed member. FIG. 4 is the conceptual diagram showing the positional relation when a carbon fiber 401 is located at the center of a position of formation of a hole 202. FIG. 5 is the conceptual diagram showing the positional relation when the carbon fiber 401 is located near an end portion of the position of formation of the hole 202. Regarding the carbon-carbon composite using the crossed member mentioned above, any of the positional relations in FIG. 4 and FIG. 5 is likely to come into being as a result of forming the holes without conducting specific positioning with respect to the arrangement of the carbon fibers.

When drilling work is performed by using a drill in the case of FIG. 4, a drill bit acts in a circumferential direction of the hole 202 (a direction indicated with an arrow A or an arrow A' in FIG. 4). In other words, the acting direction of the drill bit is perpendicular to a fiber direction of the carbon fiber 401. The strength of the carbon fiber 401 in the direction perpendicular to the fiber direction is smaller than the strengths in other directions. Accordingly, the carbon fiber 401 is cut off relatively easily in this case.

In the case of FIG. 5, the drill bit acts in the circumferential direction of the hole 202 (a direction indicated with an arrow B in FIG. 5). In other words, the acting direction of the drill bit is parallel to the fiber direction of the carbon fiber 401. The strength of the carbon fiber 401 in the direction parallel to the fiber direction is larger than the strengths in other directions. Accordingly, the carbon fiber 401 is not easily cut off in this case. The carbon fibers 401 are knitted laterally and longitudinally in the carbon-carbon composite using the crossed member. When the carbon-carbon composite using the crossed member is circularly pierced with the drill bit in rotary motion, the acting direction of the drill bit coincides with any of the directions parallel to the fibers in the longitudinal direction and the lateral direction at every 90°. Accordingly, the positional relation as shown in FIG. 5 may hold frequently in the course of processing the carbon-carbon composite using the crossed member.

FIG. 6 is an enlarged top plan view of a grid 200 after the holes 202 are formed therein. In the case of FIG. 5, the carbon fibers 401 may be left over without being cut off during the piercing. In this case, jutting portions 601 of the carbon fibers may be formed on wall surfaces of the holes as shown in FIG. 6. Furthermore, like a jutting portion 602 in FIG. 6, the jutting carbon fiber may be bent along the wall surface of the hole 202 due to a cause such as the drill bit in rotary motion dragging the carbon fiber. It is difficult to remove the jutting carbon fiber in this state.

Here, another possible solution is to align the fiber direction of the carbon fibers 401 with a thickness direction of the carbon-carbon composite as shown in FIG. 7. In this case, the drill bit acts in the direction perpendicular to the fiber direction at the time of piercing, so that the carbon fibers 401 can be cut off relatively easily. Accordingly, the jutting of the carbon fibers from the wall surfaces of the holes 202 is less likely to occur in this case. Nevertheless, the effect of rigidity enhancement by use of the carbon-carbon composite will be reduced since the carbon fibers are not oriented in a horizontal direction. It is therefore undesirable to align the fiber direction of the carbon fibers with the thickness direction.

As a consequence, while the grid is being manufactured by use of the rigid carbon-carbon composite as its material, the jutting portions 601 of the carbon fibers may be formed on the wall surfaces of the holes as shown in FIG. 6 at the time of processing the holes.

The present invention has been made in view of the aforementioned technical problems. An object of the present invention is to provide a grid, which is easy to process and is less likely to cause formation of jutting portions of carbon fibers on wall surfaces of holes at the time of processing the holes.

An aspect of the present invention provides a plate-shaped grid provided with a hole. The grid is formed of a carbon-carbon composite including carbon fibers arranged in random directions along a planar direction of the grid, and the hole is formed in the grid so as to cut off the carbon fibers.

According to the present invention, it is possible to provide a grid which is easy to process and is less likely to cause formation of jutting portions of carbon fibers on wall surfaces of holes at the time of processing the holes.

DESCRIPTION OF THE EMBODIMENTS

Figure 1:
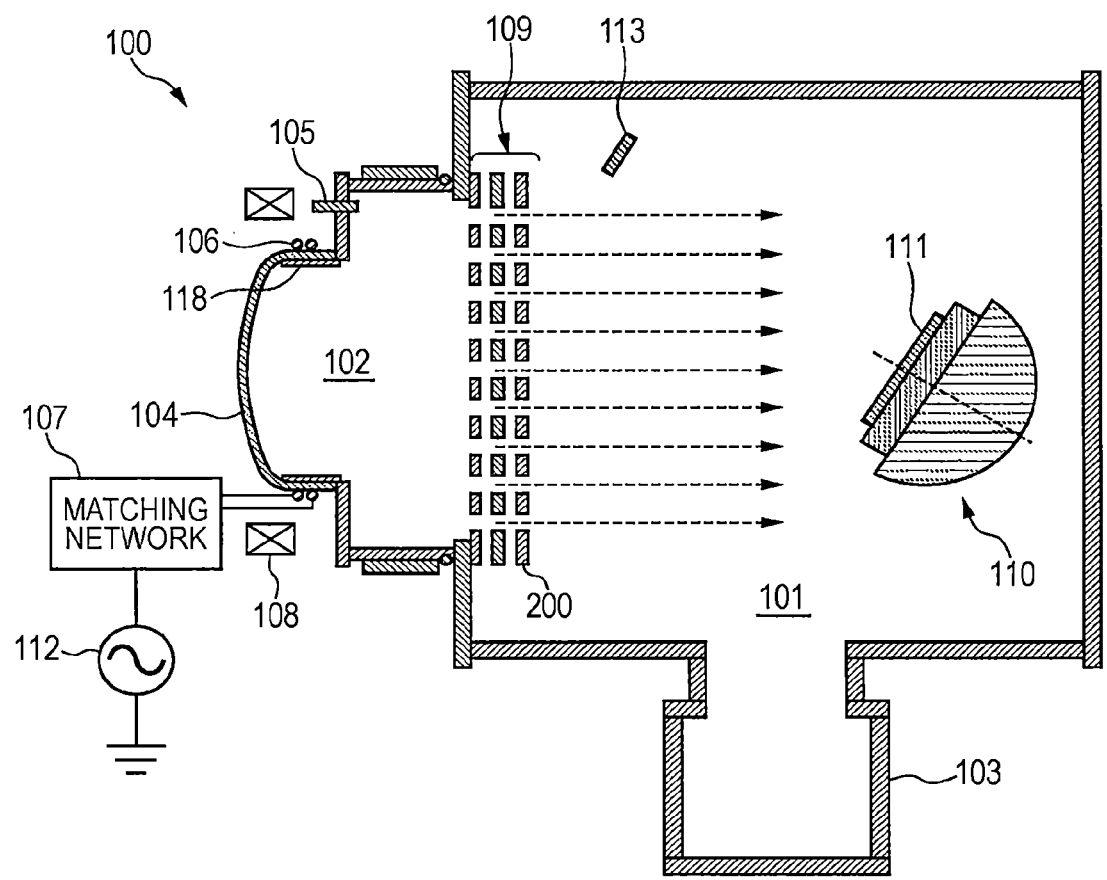
FIG. 1 is a structural drawing of an ion beam etching apparatus which uses a grid according to an embodiment of the present invention.

An embodiment of the present invention will be described below with reference to the drawings. It is to be noted, however, that the present invention is not limited only to this embodiment. In the drawings to be described below, constituents having the same functions will be denoted by the same reference numerals and repeated explanations thereof will be omitted as appropriate.

Embodiment

As an example of an ion beam processing apparatus, FIG. 1 shows a structural drawing of an ion beam etching apparatus which uses a grid according to an embodiment of the present invention. An ion beam etching apparatus 100 includes a plasma generation chamber 102 for generating plasma, and a processing chamber 101 in which etching processing takes place. As a plasma generating unit for generating the plasma, a bell jar (a discharge vessel) 104, a gas introduction unit 105, an antenna 106, and a Faraday shield 118 are installed in the plasma generation chamber 102. The bell jar 104 is part of a chamber external wall, which defines a discharge space of the plasma generation chamber 102 and keeps the inside vacuum. The gas introduction unit 105 is a portion, into which a processing gas such as argon (Ar) necessary for generation of the plasma is to be introduced. The gas introduction unit 105 is connected to a not-illustrated gas cylinder and the like. The antenna 106 is an electric power applying unit formed from conductive wiring and the like, which is used for generating the plasma inside the bell jar 104. The Faraday shield 118 is a lattice-shaped electrode made of a metal and installed on an inner wall surface of the bell jar 104. The Faraday shield 118 has a function to homogenize a high frequency electric field which is radiated from the antenna.

A discharge power supply 112 which supplies high frequency power (source power) to the antenna 106, a matching unit 107 provided between the discharge power supply 112 and the antenna 106, and an electromagnetic coil 108 which generates a magnetic field inside the bell jar 104 are provided outside the bell jar 104. A processing gas introduced from the gas introduction unit 105 is ionized by supplying the high frequency power from the discharge power supply 112 to the antenna 106 through the matching unit 107, and the plasma is thus formed inside the plasma generation chamber 102.

The processing chamber 101 includes a neutralizer 113 which neutralizes ion beams, a substrate holder 110 which is a holding unit for holding a substrate 111 being a processing object, and an evacuating pump 103 which evacuates the inside of the plasma generation chamber 102 and the processing chamber 101 and keeps the inside vacuum. The substrate holder 110 includes various substrate fixtures such as a clamp chuck. Meanwhile, the substrate holder 110 may also be provided with a drive mechanism such as a rotationrevolution mechanism for projecting the incident ion beam onto the substrate at a given position or a given angle.

A grid assembly 109 provided with holes to extract ions is installed at a boundary that separates the plasma generation chamber 102 from the processing chamber 101. The grid assembly 109 includes one or more grids 200. The plasma generated in the plasma generation chamber 102 is passed through the holes in each grid 200 and extracted to the processing chamber 101, and is then projected onto the substrate 111. A voltage is applied from a not-illustrated voltage supply to each grid 200 for the purpose of ion acceleration and the like.

An operation of ion beam projection by using the ion beam etching apparatus 100 will be described. First, the processing gas containing an inert gas such as argon (Ar) is introduced from the gas introduction unit 105 into the plasma generation chamber 102. Next, the processing gas inside the plasma generation chamber 102 is ionized by applying the high frequency power from the discharge power supply 112 to the antenna 106, and the plasma including the ions is thus generated. The ions included in the plasma generated in the plasma generation chamber 102 are accelerated by the voltage applied to each grid 200 when the ions are passed through the holes provided in the grid assembly 109. In this way, ion beams are extracted from the plasma generation chamber 102 to the processing chamber 101. After the extraction into the processing chamber 101, the ion beams are neutralized by the neutralizer 113. The neutralized beams are projected onto the substrate 111, and the etching processing takes place on a surface of the substrate.

When the grid assembly 109 has a structure in which the multiple grids 200 are stacked on one another as shown in FIG. 1, the grids 200 are preferably arranged such that the positions of the holes overlap one another when viewed in a direction perpendicular to a plane of the grid assembly 109. By arranging the holes as described above, it is possible to extract the ion beams perpendicularly to and evenly from the grid assembly 109.

Note that in this embodiment, the ion beam etching apparatus is depicted as an example of the apparatus that applies the present invention. However, the present invention is also applicable to other apparatuses. The present invention is also applicable broadly to ion beam processing apparatuses such as an ion implantation apparatus and an ion beam sputtering apparatus, which are configured to generate accelerated particles by extracting ions from plasma. Meanwhile, besides the ion beam processing apparatuses, the present invention may be employed in an application which uses a plate member that includes multiple holes and requires strength.

Figure 2:
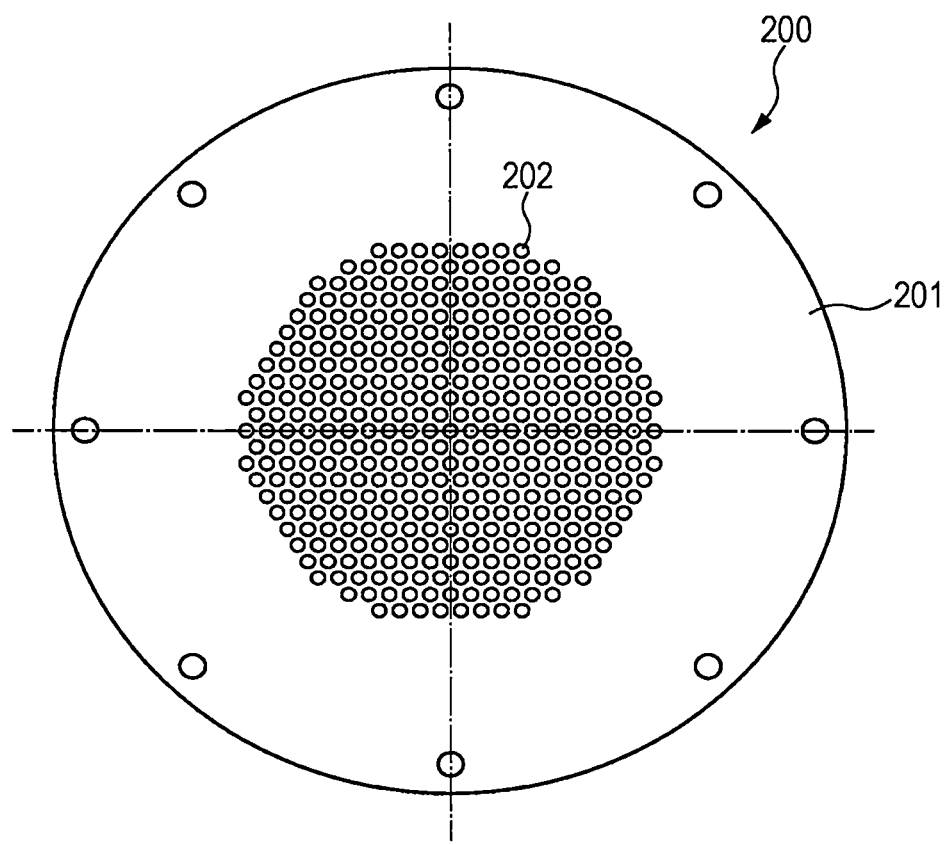
FIG. 2 is a structural drawing of the grid according to the embodiment of the present invention.

FIG. 2 is a structural drawing of the grid according to the embodiment of the present invention. The grid 200 includes multiple holes 202 formed in a grid plate 201. The grid plate 201 is a disc-shaped member made of a carbon-carbon composite as its material. In this embodiment, the grid plate 201 is formed into a circular shape. However, this shape can be changed as appropriate in accordance with the shape of an ion source to which the grid 200 is applied. Each hole 202 is a circular hole formed in the grid plate 201. Note that the shape of the hole 202 is not limited to the circular shape, but may be a shape other than the circular shape such as a polygonal shape and an oval shape.

As described above, the grid assembly 109 is installed inside the ion beam processing apparatus and the like. Along with an increase in size of semiconductor substrates in these years, the ion beam processing apparatuses are growing in size and the grid assembly 109 is also required to be increased in size. The grid assembly 109 may be installed horizontally or obliquely inside the ion beam processing apparatus. In this case, the grids 200 constituting the grid assembly 109 may be warped by their own weights, and gaps between the holes 202 in the respective grids 200 may vary. If the gaps between the holes 202 in the respective grids 200 vary, then it is difficult to extract the ion beams perpendicularly and evenly. This embodiment uses the carbon-carbon composite which is high in strength and light in weight, and is therefore less likely to cause such a problem. Moreover, the carbon-carbon composite has a low linear thermal expansion coefficient, and is therefore less likely to cause displacements of the holes 202 attributed to thermal expansion. Furthermore, since the carbon-carbon composite mainly uses carbon as its raw material, contamination is unlikely to be problematic in the course of manufacturing electronic components and the like by using the ion beam processing apparatus. From the viewpoints mentioned above, it is preferable to employ the carbon-carbon composite as the material of the grid plates 201.

Figure 3:
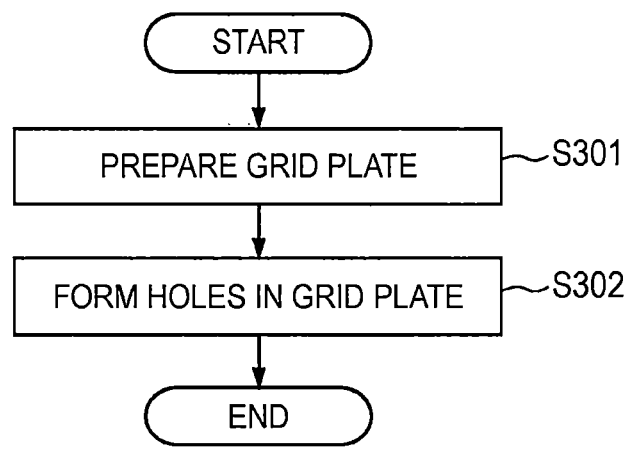
FIG. 3 is a flowchart showing a method of manufacturing a grid using a carbon-carbon composite.
Figure 4:
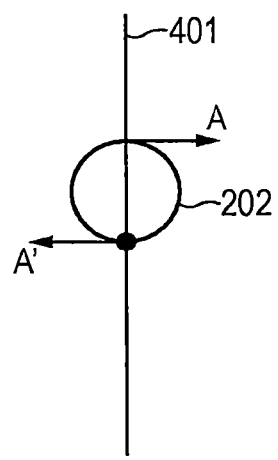
FIG. 4 is a conceptual diagram showing a positional relation when a carbon fiber is located at the center of a position of formation of a hole.
Figure 5:
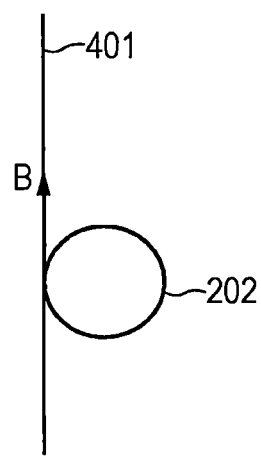
FIG. 5 is a conceptual diagram showing a positional relation when the carbon fiber is located near an end portion of the position of formation of the hole.
Figure 6:
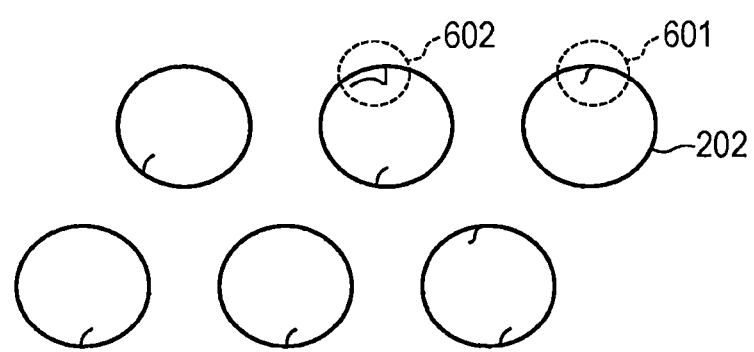
FIG. 6 is an enlarged top plan view of the grid after forming holes therein.
Figure 7:
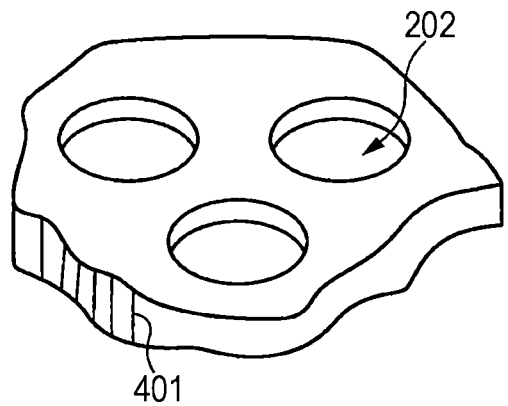
FIG. 7 is a diagram showing a state in which a fiber direction of carbon fibers is aligned with a thickness direction of a carbon-carbon composite.

FIG. 3 is a flowchart showing a method of manufacturing the grid using the carbon-carbon composite. In step S301, the grid plate 201 to serve as the material of the grid 200 is prepared. A carbon-carbon composite plate processed into a given thickness and a given size in accordance with the design of the ion beam etching apparatus 100 is used for the grid plate 201. While details will be described later, the carbon-carbon composite used in this step includes carbon fibers in the form of a chopped member.

In step S302, the multiple holes 202 are formed in the grid plate 201. Performances of the ion beam etching apparatus 100 including an etching rate, straightness of the beam, and the like vary depending on the arrangement of the holes 202, hole sizes, and the like. Accordingly, in the course of processing the grid 200 for the ion beam processing apparatus, the numerous holes 202 are required to be formed stably at a predetermined pitch and with predetermined dimensions. In view of these requirements, in order to form the holes stably and at low cost, it is preferable to form the holes by using a device provided with a processing tool such as a drill and an end mill, which performs cutting by rotary motion. The following description will be given on the assumption that the holes 202 are to be formed by using the drill.

Next, the carbon-carbon composite to be employed as the material of the grid plate 201 will be described. The carbon-carbon composite is a composite material in which carbon fibers that are reinforcing members are arranged inside a carbon matrix (a base material) which is a supporting member. Mechanical strength such as rigidity can be improved by combining the multiple materials. Particularly, the strength in the fiber direction of each carbon fiber is further improved.

As described above, examples of the carbon fibers used for manufacturing the carbon-carbon composite include the crossed member and the chopped member. The crossed member is prepared by knitting bundles of carbon fibers regularly in the longitudinal and lateral directions into a woven fabric form. The carbon-carbon composite using the crossed member is manufactured by impregnating the crossed member with the carbon-containing raw material for the matrix such as a thermosetting resin, and then heating and carbonizing the crossed member. As a consequence, the carbon-carbon composite using the crossed member contains the carbon fibers that expand in two directions perpendicular to each other, namely, in the longitudinal direction and the lateral direction.

On the other hand, the chopped member (also referred to as chopped carbon fibers) is a material containing short fibers prepared by chopping carbon fibers in filaments into predetermined lengths (cutting the carbon fibers into small pieces). The carbon-carbon composite using the chopped member is manufactured by impregnating the chopped member processed into a mat-like shape with a resin, and then subjecting the chopped member to a thermal treatment. At this time, the fibers of the chopped member are not aligned in a certain direction, but are oriented in random directions in terms of a two-dimensional direction (a planar direction) or random directions in terms of a three-dimensional direction. As a consequence, the carbon-carbon composite using the chopped member contains the carbon fibers in the random directions in terms of the planar direction or the three-dimensional direction. Here, the expression "random directions" means a state in which the carbon fibers are in a disorganized state as a whole without having a certain order such as a periodic structure and symmetry. For example, a state in which there is a region where the carbon fibers are partially aligned in parallel but there is not the certain order of the directions of the carbon fibers as a whole, is also assumed to be included in the state of containing the carbon fibers in the "random directions".

In this embodiment, the carbon-carbon composite using the chopped member is employed as the material of the grid 200 instead of that using the afore-mentioned crossed member. Reasons why the use of the chopped member is preferable will be described below while comparing this case with the case of using the crossed member.

As described previously, when the carbon-carbon composite using the crossed member is employed as the material of each grid 200 for the ion beam etching apparatus 100, the carbon fibers may jut out from the holes after the processing. If this grid 200 is applied to the ion beam etching apparatus 100, abnormal discharge originating from jutting portions 601 and 602 of the carbon fibers may occur at the time of operating the ion beam etching apparatus 100. A possible option to solve this problem is to remove the carbon fibers jutting out from the holes after the processing of the grid 200. For example, reprocessing by use of the drill, removal by aging processing, or the like is presumable. However, such removal processing is costly. Accordingly, it is difficult to employ the carbon-carbon composite using the crossed member as the material of each grid 200 for the ion beam etching apparatus 100.

Figure 8A:
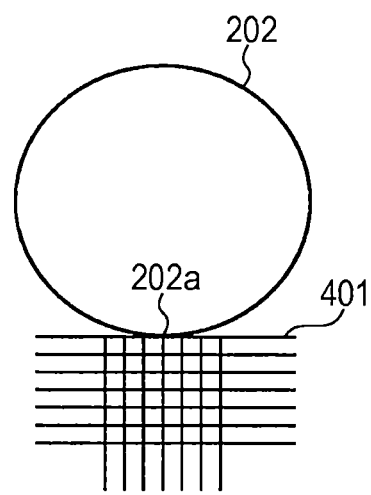
FIGS. 8A and 8B are a diagram showing a difference in fiber direction between a crossed member and a chopped member.
Figure 8B:
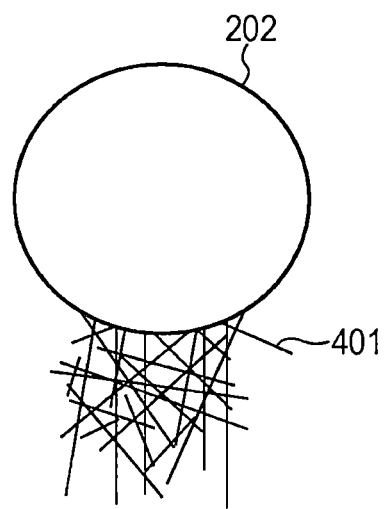

FIG. 8A is a diagram showing a relation between a hole formed in the carbon-carbon composite using the crossed member and arrangement of the carbon fibers. FIG. 8B is a diagram showing a relation between a hole formed in the carbon-carbon composite using the chopped member and arrangement of the carbon fibers. Note that these drawings depict as if there are the carbon fibers only at portions below the holes for the purpose of omission. In reality, however, the carbon fibers are arranged likewise entirely around the holes. In the carbon-carbon composite using the crossed member as shown in FIG. 8A, the directions of the carbon fibers 401 are aligned in a vertical direction and a horizontal direction in FIG. 8A. As a consequence, there is a portion on the circumference of the hole 202, such as a hole lower end 202a, where the carbon fibers 401 are not easily cut off. For this reason, this case may cause a first problem of jutting the carbon fibers out from the wall surfaces of the holes 202.

On the other hand, in the carbon-carbon composite using the chopped member, the directions of the carbon fibers 401 are random and not aligned in a certain direction as shown in FIG. 8B. For this reason, there is not any certain portion on the circumference of the hole 202 which is not easily cut off. Accordingly, by employing the carbon-carbon composite using the chopped member, the carbon fibers are inhibited from jutting out from the wall surfaces of the holes unlike the case of processing the carbon-carbon composite using the crossed member as mentioned above.

Figure 9:
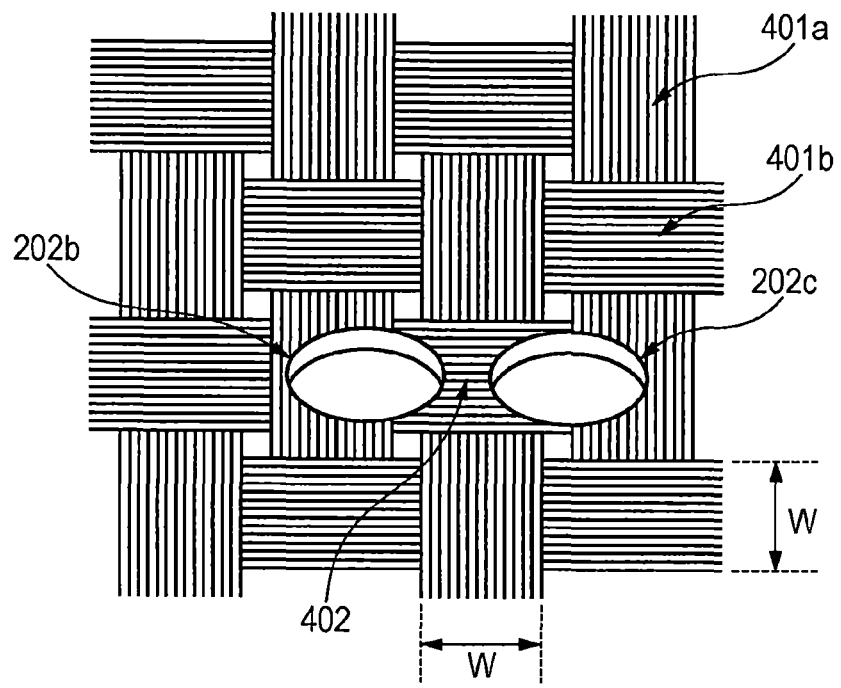
FIG. 9 is an enlarged diagram showing fiber directions of the crossed member.
Figure 10A:
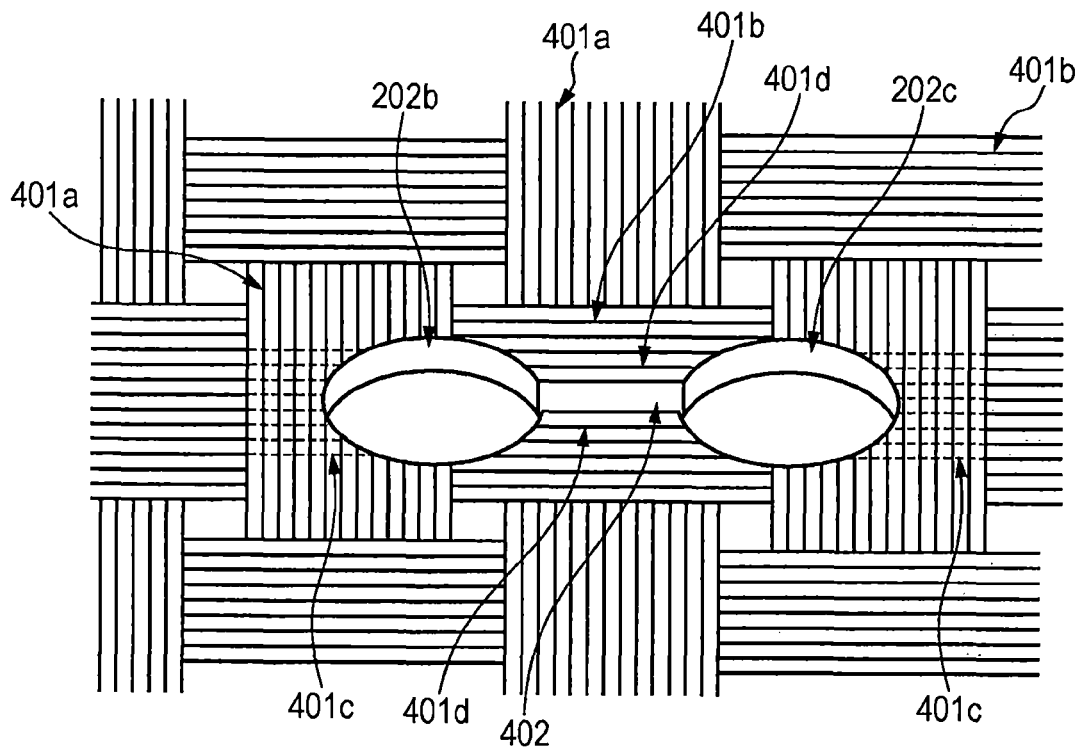
FIGS. 10A and 10B are a conceptual diagram showing a case of forming holes in the grid while using the crossed member and the chopped member.
Figure 10B:
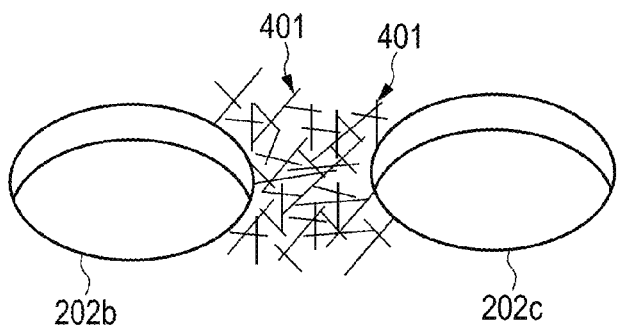

Next, a second problem in the case where the grid provided with the holes by using the crossed member of FIG. 8A is employed in the ion beam processing apparatus will be described by using FIG. 9, FIG. 10A, and FIG. 10B. FIG. 9 is an enlarged diagram showing fiber directions of the crossed member. FIG. 10A is a conceptual diagram showing the case of forming the holes in the grid while using the crossed member. FIG. 10B is a conceptual diagram showing the case of forming the holes in the grid while using the chopped member.

In the carbon-carbon composite using the crossed member as shown in FIG. 8A, the directions of the carbon fibers 401 are aligned in the vertical direction and the horizontal direction in FIG. 8A. As shown in FIG. 9, the crossed member has a structure in which bundles 401a of the carbon fibers in the vertical direction each at a prescribed width W and bundles 401b of the carbon fibers in the horizontal direction each at the prescribed width W are woven together. Accordingly, when a left hole 202b and a right hole 202c are formed in the grid plate 201 and at a width smaller than the width W, a portion where the bundle 401a of the carbon fibers in the vertical direction and the bundle 401b of the carbon fibers in the horizontal direction are woven together may not be present between the left hole 202b and the right hole 202c as shown in FIG. 9. At such a position, part of the carbon fibers 401 may come off in a lump, thereby creating a level difference 402. In this case, as shown in FIG. 10A, the level difference 402 may occur on part of a surface at a portion of the grid plate 201 between the left hole 202b and the right hole 202c, which may cause the second problem of changes in shape of the holes 202 attributed to the level difference 402.

The second problem will be described. At an outer peripheral portion other than a right side from the center of the left hole 202b and a left side from the center of the right hole 202c in FIG. 10A, the bundles 401b of the carbon fibers in the horizontal direction on a first layer remain on the surface and no level difference occurs therein. On the other hand, the bundle 401b of the carbon fibers in the horizontal direction on the first layer located near the space between the right side from the center of the left hole 202b and the left side from the center of the right hole 202c in FIG. 10A is cut into bundles 401c and 401d of the carbon fibers due to formation of the holes. The bundle 401d of the carbon fibers in the horizontal direction on the first layer, which is isolated by being cut off by the left hole 202b and the right hole 202c, comes off in a lump. Hence, the bundle 401a of the carbon fibers in the vertical direction on a second layer emerges on the surface. In this way, the level difference 402 comes into being between a right portion of the circumference of the left hole 202b and a left portion of the circumference of the right hole 202c. The level difference 402 chips off portions near the right side from the center of the left hole 202b and the left side from the center of the right hole 202c, and shapes of the holes are changed, thereby causing the above-mentioned second problem.

In the ion beam processing apparatus, if the shapes of the holes 202 in the grids are changed, the shapes of the ion beams are distorted. The distortion in shape of the ion beams adversely affects scatter angles of the ion beams, thereby causing a problem of deterioration in processing accuracy (such as a shape of an etched section in the case of the ion beam etching apparatus, and film thickness distribution of a deposited substance to be deposited on the substrate in the case of an ion beam film deposition apparatus).

On the other hand, as shown in FIG. 8B, in the carbon-carbon composite using the chopped member, the directions of the carbon fibers 401 are random and are not aligned in a certain direction. Accordingly, as shown in FIG. 10B, it is less likely that part of the carbon fibers 401 comes off in a lump at the time of processing the holes 202. As a consequence, the problem of changes in shape of the holes 202, which is attributed to the partial chipping off of the circumferences of the holes 202, is less likely to occur.

Next, a third problem in the case where the grid provided with the holes by using the crossed member in FIG. 8A is employed in the ion beam processing apparatus will be described.

When the ion beam processing is performed by using the ion beam processing apparatus, the processing object scatters from the substrate and adheres to the grid. In the case of the grid using the crossed member in FIG. 8A, the grid may cause a third problem that the processing object having adhered to the grid comes off the grid and adheres to the substrate. On the other hand, when the grid using the chopped member in FIG. 8B is employed in the ion beam processing apparatus, it is possible to solve the third problem that the processing object having adhered to the grid comes off the grid and adheres to the substrate.

A reason why the processing object having adhered to the grid does not come off the grid when the grid using the chopped member in FIG. 8B is employed in the ion beam processing apparatus, will be described on the basis of a technical consideration.

In the case of the grid using the crossed member in FIG. 8A, the directions of the carbon fibers 401 are aligned in the vertical direction and the horizontal direction in FIG. 8A. Accordingly, an indented pattern to be formed on the surface of the grid has regularity and the surface is flat at the same time. The surface therefore has a small force to retain the adhering object. For this reason, when the grid using the crossed member in FIG. 8A is employed in the ion beam processing apparatus, the processing object having adhered to the grid may come off the grid and adhere to the substrate. Hence, this grid cannot solve the third problem.

On the other hand, in the case of the chopped member in FIG. 8B, an indented pattern to be formed on the surface of the grid has an irregular shape, and terminal ends of the carbon fibers are partially exposed. The surface therefore has a large force to retain the adhering object. For this reason, when the grid using the chopped member in FIG. 8B is employed in the ion beam processing apparatus, the processing object having adhered to the grid is retained by the carbon fibers. Hence, this grid can solve the third problem.

Prototype Example 1

Figure 11A:
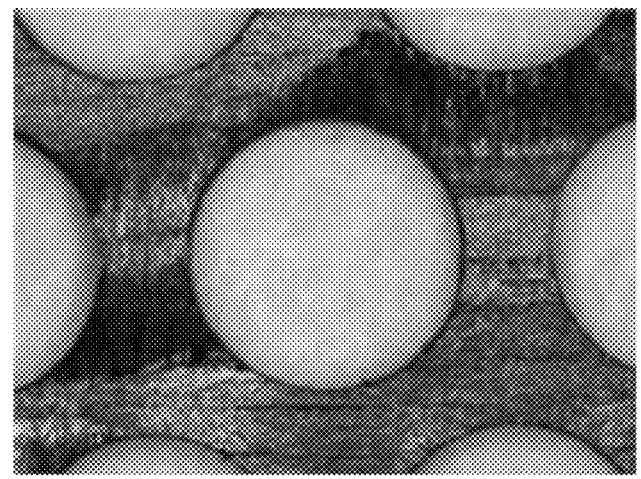
FIGS 11A to 11D are a first micrograph of a portion near the holes in the grid which employs the carbon-carbon composite.
Figure 11B:
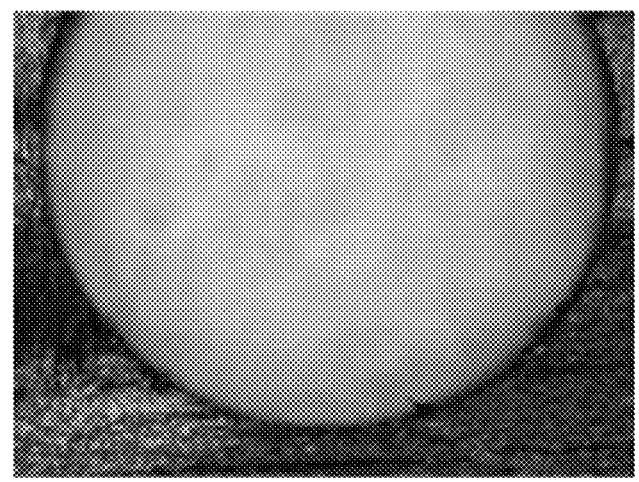

FIG. 11A to FIG. 11D show first micrographs of portions near the holes in the grids which employ the carbon-carbon composites. FIG. 11A is the micrograph of the holes in the carbon-carbon composite using the crossed member. FIG. 11B is an enlarged view of one of the holes shown in FIG. 11A. The presence of the first problem of formation of multiple fibrous jutting portions from the wall surface of the hole can be confirmed particularly with reference to FIG. 11B.

Figure 11C:
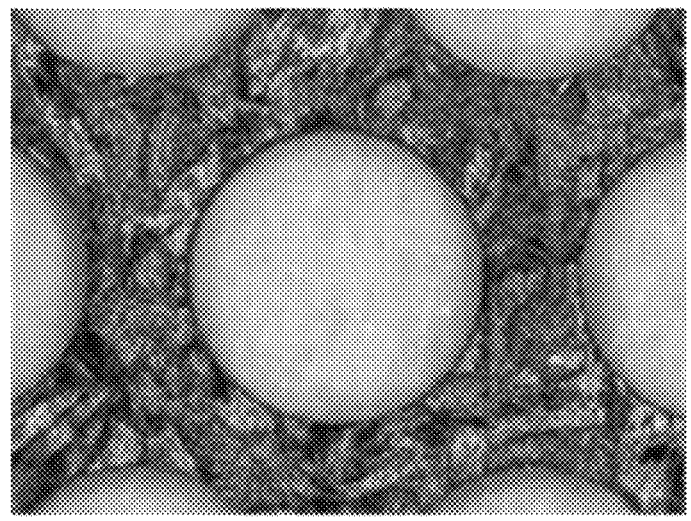
Figure 11D:

On the other hand, FIG. 11C is the micrograph of the holes in the carbon-carbon composite using the chopped member. FIG. 11D is an enlarged view of one of the holes shown in FIG. 11C. The absence of fibrous jutting portions like those observed in FIG. 11B can be confirmed particularly with reference to FIG. 11D. Thus, it is confirmed that the jutting of the carbon fibers out from the wall surfaces of the holes can be suppressed by employing the carbon-carbon composite using the chopped member as the material of the grid plate.

Prototype Example 2

Figure 12A:
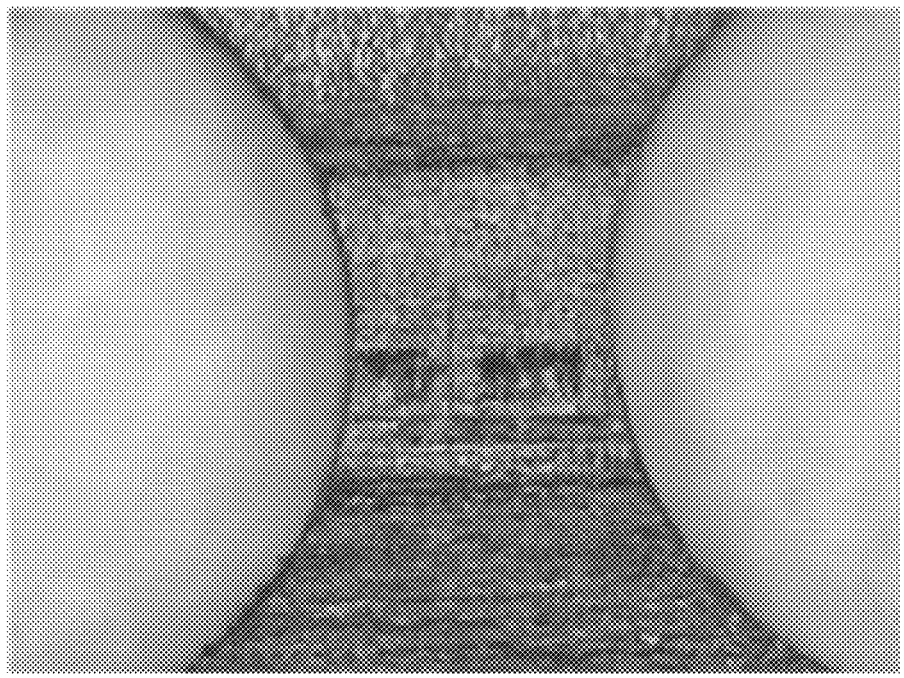
FIGS. 12A and 12B are a second micrograph of a portion near the holes in the grid which employs the carbon-carbon composite.
Figure 12B:
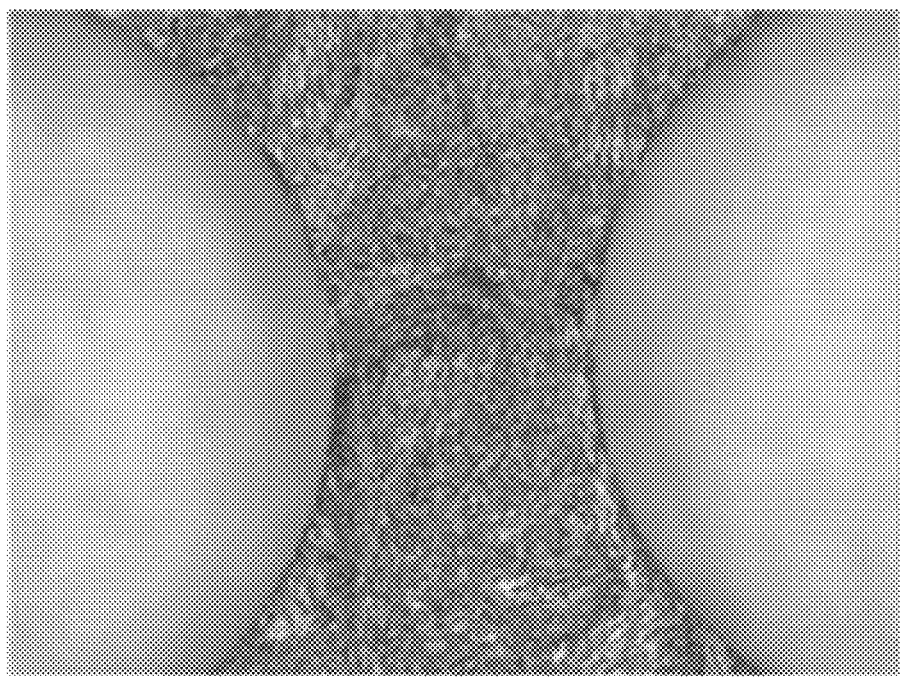

FIG. 12A and FIG. 12B show second micrographs of portions near the holes in the grids which employ the carbon-carbon composites. FIG. 12A is the micrograph of the holes in the carbon-carbon composite using the crossed member. With reference to FIG. 12A, the carbon fibers on the first layer between the right side from the center of the hole on the left side and the left side from the center of the hole on the right side are cut off by the formation of the holes, and the carbon fibers thereon come off at a lump. As a consequence, at this position, the carbon fibers on the second layer emerge on the surface (as a portion at a central part which looks white in the micrograph in FIG. 12A). Thus, the presence of the second problem of occurrence of the level difference on the right portion of the circumference of the hole on the left side and the left portion of the circumference of the hole on the right side can be confirmed.

On the other hand, FIG. 12B is the micrograph of the portion near the holes in the grid employing the carbon-carbon composite using the chopped member. With reference to FIG. 12B, it was confirmed that the above-described second problem was absent, and that the hole shapes of the hole on the left side and the hole on the right side were not changed (no portion that looks white comes into being in the case of the micrograph in FIG. 12B).

According to the embodiment and the prototype examples described above, the grid for ion beam etching apparatus employing the rigid carbon-carbon composite can be produced by adopting the chopped member as the material of the carbon fibers. Since the carbon fibers are randomly arranged, it is not necessary to conduct positioning of the locations to form the holes with respect to the positions of the carbon fibers. Moreover, since the carbon fibers are inhibited from jutting out in the holes, abnormal discharge that would originate from the jutting portions is suppressed at the time of operating the ion beam etching apparatus 100. Accordingly, it is possible to reduce or eliminate the step of removing the jutting carbon fibers. Due to these reasons, the grid is manufactured easily and at low cost. Thus, it is possible to provide the grid which is high in rigidity and easy to process.

Modified Example

At least part of the grid 200 of this embodiment may be coated with a material which is different from carbon being the main component of the carbon-carbon composite. For example, it is possible to use a metal, a carbon coating of vapor grown carbon or glasslike carbon, or an insulating body as the coating material. By conducting the coating after the formation of the holes 202, the jutting of the carbon fibers can be suppressed more reliably.

The grid 200 of this embodiment is applicable not only to the ion beam etching apparatus shown in FIG. 1, but also to ion beam processing apparatuses such as an ion beam film deposition apparatus. Note that a publicly known ion beam film deposition apparatus is used when the grid 200 of this embodiment is employed in the ion beam film deposition apparatus.

The invention claimed is:

1. A plate-shaped grid provided with a hole, wherein
 the grid is formed of a carbon-carbon composite including carbon fibers arranged in random directions along a planar direction of the grid, and
 the hole is formed in the grid so as to cut off the carbon fibers.

2. The grid according to claim 1, wherein the carbon fibers included in the carbon-carbon composite are chopped carbon fibers.

3. The grid according to claim 1, wherein at least part of the carbon-carbon composite is coated with a different material from the carbon-carbon composite.

4. An ion beam processing apparatus comprising:
 a plasma generating unit;
 a processing chamber; and
 a grid assembly including the grid according to claim 1 and configured to extract ions from plasma generated by the plasma generating unit to the processing chamber.

5. A method of manufacturing a grid comprising:
 preparing a plate-shaped carbon-carbon composite including carbon fibers arranged in random directions along a planar direction of the carbon-carbon composite; and
 forming a hole in the carbon-carbon composite so as to cut off the carbon fibers by using a processing tool configured to perform cutting by rotary motion.

* * * * *